United States Patent [19]

Okamura et al.

[11] 4,032,913
[45] June 28, 1977

[54] CODING EQUIPMENT PROVIDING COMPRESSED CODE

[75] Inventors: Masami Okamura, Musashino; Fumio Aoki, Yokohama; Yoshihiro Sano, Katsuta; Jun-ichi Makino, Hitachi; Yoshiteru Miki, Hitachi; Hiroshi Sasaki, Hitachi; Kazuo Seo, Hitachi, all of Japan

[73] Assignees: Hitachi, Ltd.; The Tokyo Electric Power Co., Inc., both of Japan

[22] Filed: Apr. 9, 1974

[21] Appl. No.: 459,386

[30] Foreign Application Priority Data

Apr. 9, 1973   Japan ............................ 48-39483

[52] U.S. Cl. ................... 340/347 AD; 179/15 AV; 340/347 M
[51] Int. Cl.² ...................................... H03K 13/02
[58] Field of Search ............ 340/347 AD, 347 DD; 179/15 AV

[56] References Cited

UNITED STATES PATENTS

| | | |
|---|---|---|
| 2,970,309 | 1/1961 | Towles ............................ 340/347 |
| 3,069,504 | 12/1962 | Kaneko ........................... 179/15 BS |
| 3,460,132 | 8/1969 | Juliusburger et al. ............. 340/347 |
| 3,500,247 | 3/1970 | Sekimoto et al. ............ 340/347 AD |
| 3,594,560 | 6/1971 | Stanley ............................ 235/154 |
| 3,618,047 | 11/1971 | Hertz ............................ 340/172.5 |
| 3,631,464 | 12/1971 | Dahlberg ..................... 340/347 DD |
| 3,681,574 | 8/1972 | Caulkin .......................... 235/92 SH |
| 3,688,221 | 8/1972 | Fruhalf ....................... 340/347 AD |
| 3,789,392 | 1/1974 | Candiani ..................... 340/347 DD |
| 3,855,589 | 12/1974 | Solender .................... 340/347 AD |

*Primary Examiner*—Thomas J. Sloyan
*Attorney, Agent, or Firm*—Craig & Antonelli

[57] ABSTRACT

In a parallel digital signal delivered from an AD converter, "1" appearing in a bit position nearest to the most significant digit (MSD) is detected, and the parallel digital signal is converted into a serial digital signal consisting of a weight character indicating this specific bit position and a data character indicating the numerical value of the data. Further, a weight bit is provided for changing the weight of the output of the AD converter depending on the analog quantity subjected to AD conversion so as to reduce the number of bits required for coding the parallel signal.

4 Claims, 14 Drawing Figures

CODING EQUIPMENT PROVIDING COMPRESSED CODE

BACKGROUND OF THE INVENTION

1. Field of the Invention

This invention relates to a coding equipment for converting a parallel digital signal into a serial digital signal.

2. Description

It is commonly known that, in a centralized control of physical quantities such as voltage, current and temperature measured at remote points, these physical quantities are sampled with a suitable period at the individual measuring points, and after converting the respective sampled physical quantities into parallel digital signals by an analog-digital converter, these parallel digital signals are converted into a succession of serial digital signals to be transmitted to a central control station. In this case, in order that the information processing, storing and other operations in the central control station can be efficiently carried out, it is required that the information transmitted one after another in the form of the serial digital signal have the same number of bits regardless of the magnitude of the absolute value of the physical quantities sampled periodically. On the other hand, however, the fact that the information transmitted one after another in the form of the serial digital signal have the same number of bits means that the greatest value of each information is also limited to a predetermined number of bits even when great variations occur in the physical quantities. Thus, the magnitude of the physical quantity corresponding to the least significant digit (LSD) is inevitably increased resulting frequently in a great error when the physical quantity is small.

In an effort to obviate the above defect, a proposal is made in, for example, U.S. Pat. No. 3,298,016 in which the magnitude of a physical quantity is coded as a combination of a numerical value of a predetermined number of digits making possible to express the numerical value by a predetermined number of bits and an index representing the largeness of the numerical value. This proposal is effective from the standpoint that physical quantities are converted into signals of the same number of bits and can be coded with high precision. However, the means disclosed in this proposal cannot be utilized when a fully digital unit is desired due to the fact that means for handling an analog quantity is included therein.

SUMMARY OF THE INVENTION

It is therefore a primary object of the present invention to provide a coding equipment in which a parallel digital signal can be converted into a serial digital signal of predetermined number of bits without handling any analog quantity.

According to the present invention, the bit position of the most significant digit (MSD) in a parallel digital signal corresponding to a physical quantity is detected and coding is controlled depending on this bit position so that the physical quantity can be coded with high precision in a fully digital fashion.

DESCRIPTION OF THE PREFERRED EMBODIMENTS

The present invention will be described in detail with reference to an application in which a physical quantity sampled with a predetermined period is subjected to analog-digital conversion for measurement.

When physical quantities are measured and the measured quantities are transmitted in large amounts, a digital signal transmission system is generally employed in view of the advantages from the standpoints of the required frequency band and information processing, storing and other operations in a receiving station. In this system, therefore, an analog-digital converter is disposed in the transmitting station for converting various analog values measured at measuring points into digital quantities, and then the digital quantities are arranged in the form of a series signal to be transmitted to the receiving station. In this case, the maximum value of the error due to the AD conversion is given by $\pm \frac{1}{2}$ of the least significant digit (LSD). Therefore, when the full scale of the AD converter is N, the maximum value of the error is given by $\pm \frac{1}{2} \cdot (1/2^N)$, and the error $\epsilon$ due to the AD conversion is generally expressed as follows:

$$\epsilon \leq \pm \frac{1}{2^{N+1}} \quad (1)$$

Figure 1A:
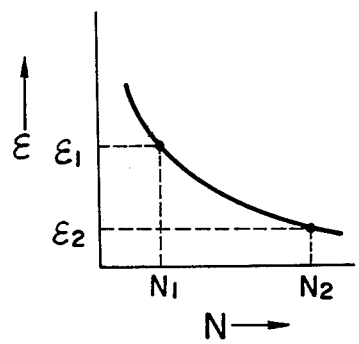
Figure 1B:
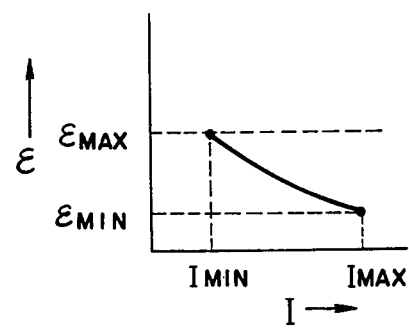
Figure 2:
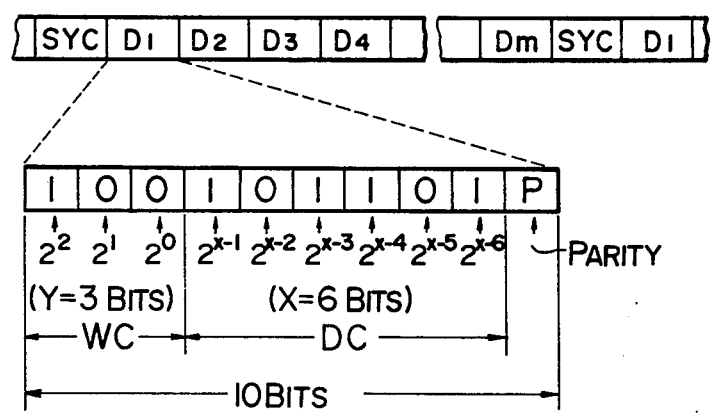
FIG. 2 shows a manner of information transmission according to the present invention.

This relation is shown in FIG. 1a in which the horizontal axis represents the scale N and the vertical axis represents the error $\epsilon$. It will be seen that the error $\epsilon$ is $\epsilon_1$ when $N = N_1$, and this error $\epsilon$ is $\epsilon_2$ ($\epsilon_2 < \epsilon_1$) when $N = N_2$ ($N_2 > N_1$). Thus, the error $\epsilon$ is reduced with the increase in the scale N.

On the other hand, the maximum value $I_{MAX}$ and minimum value $I_{MIN}$ of the analog input I are determined depending on the transmission system. In order that the conversion error $\epsilon$ of the AD converter can be limited to lower than an allowable maximum error $\epsilon_{MAX}$ allowable for the specific system, these values must be selected to satisfy the following relation (2) which is a severest condition:

$$\frac{I_{MAX}}{} \quad (2)$$

data character DC to the transmitted, that is, the position of the TMSD in the AD converted data of $N = 12$ bits. Thus, the weight character coding circuit 6 may be constructed to satisfy the condition described below. That is, the weight character coding circuit 6 may deliver "110" when the TMSD detected by the transfer control instruction circuit 5 lies in the bit position $2^{11}$, hence when the output signal of 1 level appears on the line 511. In other words, the weight character coding circuit 6 may apply a signal of 1 level, a signal of 1 level and a signal of "0" level to the PS converter 8 by the lines 602, 601 and 600 respectively. Similarly, the weight character coding circuit 6 may deliver "101" when the detected TMSD lies in the bit position $2^{10}$, hence when the signal of 1 level appears on the line 510, "100" when the detected TMSD lies in the bit position $2^9$, hence when the signal of 1 level appears on the line 509, "011" when the detected TMSD lies in the bit position $2^8$, hence when the signal of 1 level appears on the line 508, "010" when the detected TMSD lies in the bit position $2^7$, hence when the signal of 1 level appears on the line 507, "001" when the detected TMSD lies in the bit position $2^6$, hence when the signal of 1 level appears on the line 506, and "000" when the detected TMSD lies in one of the bit positions $2^5$ to $2^0$, hence when the signal of 1 level appears on the line 505. The respective output signals are applied by the lines 602 to 600 to the PS converter 8. Therefore, the weight character coding circuit 6 may have a structure as shown in FIG. 5.

Figure 5:
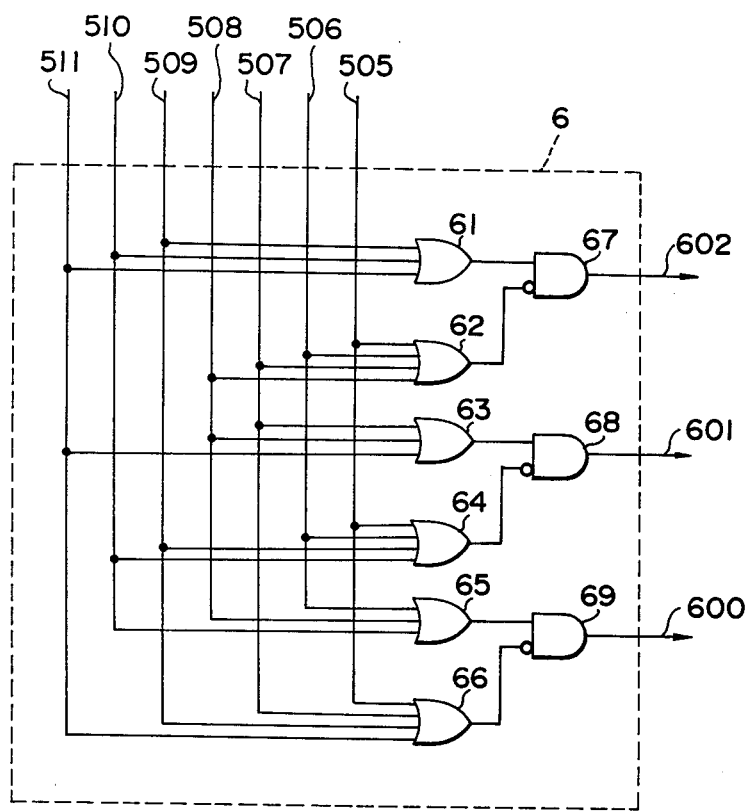
FIG. 5 shows the detailed structure of the block 6 in FIG. 3.

Referring to FIG. 5, the weight character coding circuit 6 includes a plurality of OR gates 61 to 66, and a plurality of INHIBIT gates 67 to 69. The input is applied by the lines 505 to 511 and the output is delivered by the lines 600 to 602. The OR gates 62, 64, 66 and INHIBIT gates 67, 68, 69 are not necessarily required due to the fact that the input signal of 1 level appears generally on only one of the lines 505 to 511.

The function of the data transfer gate 7 is such that, in response to the instruction signal applied from the transfer control instruction circuit 5, the data character DC of $X = 6$ bits starting from the TMSD in the sampled and AD converted data information written in the buffer register 4 is applied to the PS converter 8. Thus, the data transfer gate 7 must be constructed to respond to the instruction signal applied from the transfer control instruction circuit 5. That is, when the TMSD detected by the transfer control instruction circuit 5 lies in the bit position $2^{11}$, hence when the signal of 1 level appears on the line 511, the six-bit data information ranging from $2^{11}$ to $2^6$ in the buffer register 4 may be applied to the PS converter 8 by the lines 705 to 700 in the sequential order starting from the TMSD. Similarly, the six-bit data information ranging from $2^{10}$ to $2^5$ may be applied to the PS converter 8 by the lines 705 to 700 when the detected TMSD lies in the bit position $2^{10}$, hence when the signal of 1 level appears on the line 510, the six-bit data information ranging from $2^9$ to $2^4$ when the detected TMSD lies in the bit position $2^9$, hence when the signal of 1 level appears on the line 509, the six-bit data information ranging from $2^8$ to $2^3$ when the detected TMSD lies in the bit position $2^8$, hence when the signal of 1 level appears on the line 508, the six-bit data information ranging from $2^7$ to $2^2$ when the detected TMSD lies in the bit position $2^7$, hence when the signal of 1 level appears on the line 507, the six-bit data information ranging from $2^6$ to $2^1$ when the detected TMSD lies in the bit position $2^6$, hence when the signal of 1 appears on the line 506, and the six-bit data information ranging from $2^5$ to $2^0$ when the detected TMSD lies in one of the bit positions $2^5$ and $2^0$, hence when the signal of 1 level appears on the line 505. Therefore, the data transfer gate 7 may have a structure as shown in FIGS. 6a and 6b.

Figure 6A:
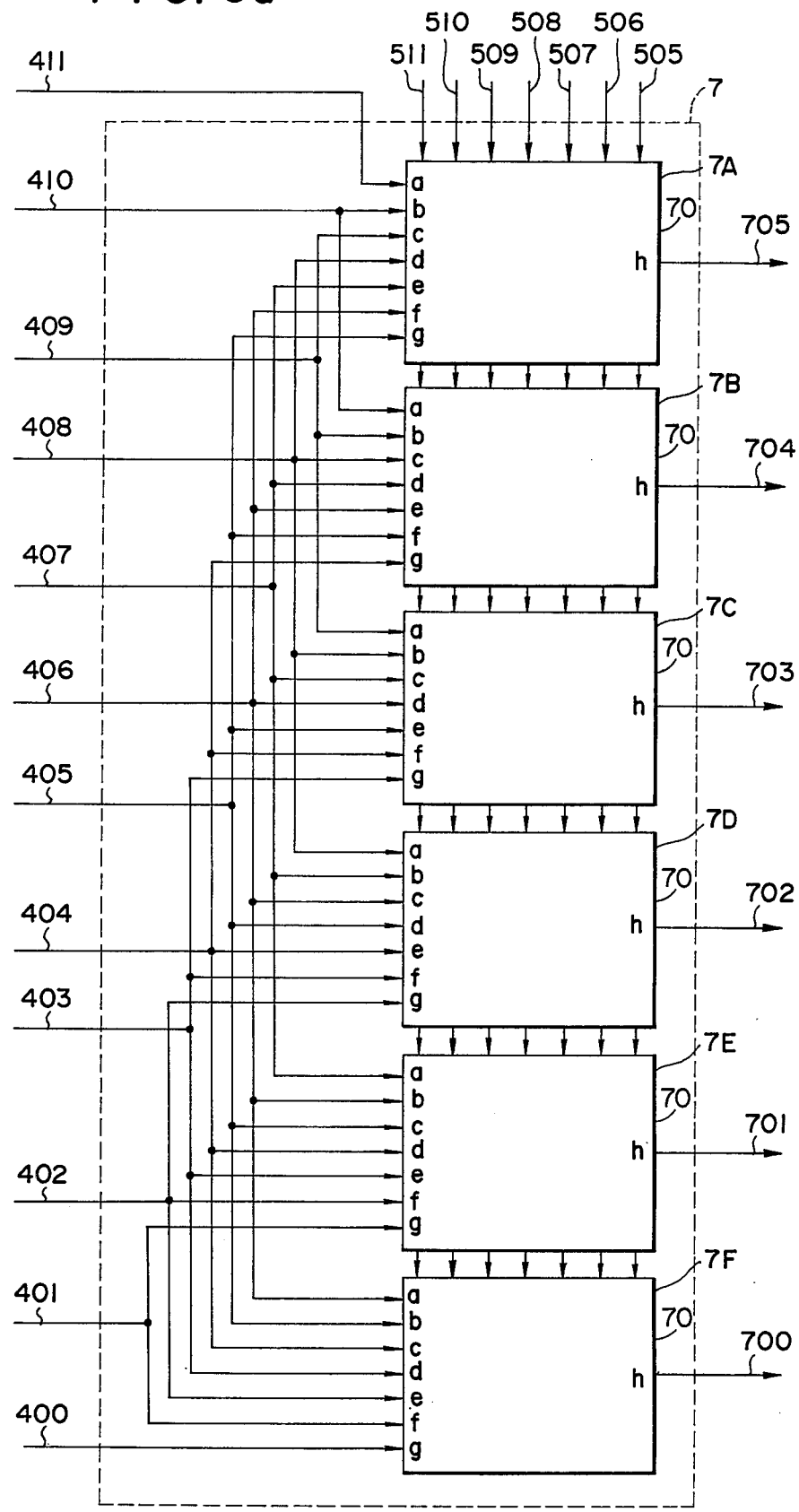
FIGS. 6a and 6b show the detailed structure of the block 7 in FIG. 3.
Figure 6B:
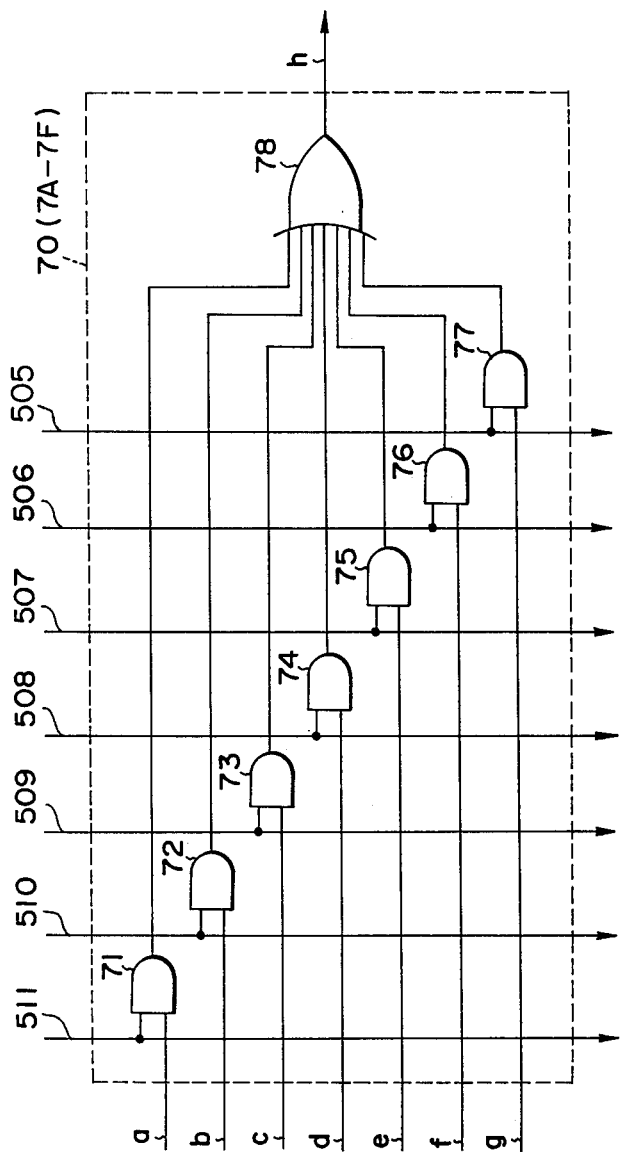

Referring to FIG. 6a, the data transfer gate 7 is composed of six blocks 7A to 7F each of which has a structure 70 as shown in detail in FIG. 6b. Referring to FIG. 6b, the block 70 includes a plurality of AND gates 71 to 77 and an OR gate 78 to which the outputs of these AND gates 71 to 77 are applied. Input lines $a$, $b$, $c$, $d$, $e$, $f$ and $g$ of each of the blocks 7A to 7F shown in FIG. 6a must be connected to the corresponding seven lines among the lines 400 to 411. Further, an output line $h$ of the block 70 shown in FIG. 6b must be connected to the corresponding line among the lines 700 to 705 as shown in FIG. 6a.

It is apparent that the reduction in the number of bits described previously can be realized by the provision of the parts having structures as above described. The PS converter 8 which provides a series signal on the basis of input signals may have a structure commonly known in the art.

Figure 7A:
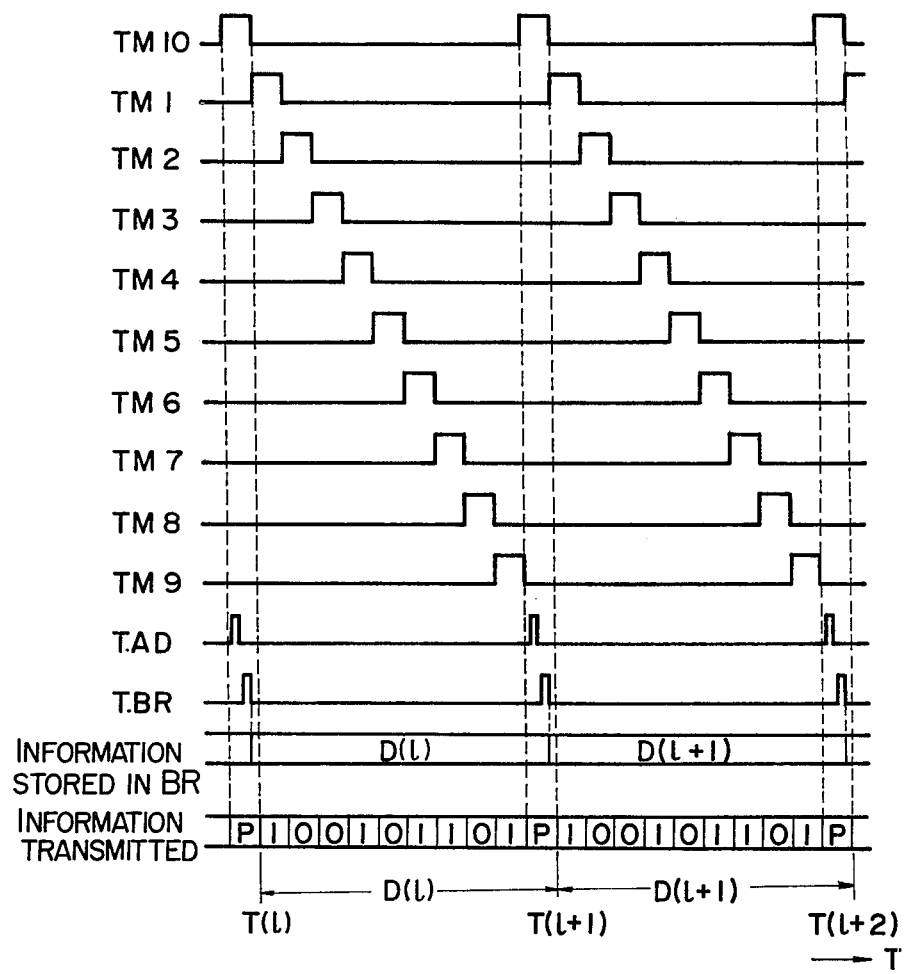
FIGS. 7a and 7b are time charts illustrating the operation of the embodiment of the present invention.
Figure 7B:
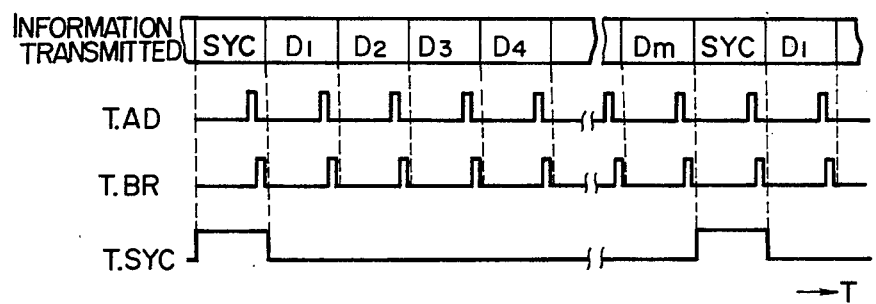

FIGS. 7a and 7b are time charts showing the waveform of timing regulating pulses applied from the timing control circuit 2 during this PS conversion and showing the manner of providing a serial signal. As shown in FIG. 7a, an AD conversion instruction pulse TAD appears when the timing signal TM10 is in the 1 level, and a write instruction pulse TBR for writing the output of the AD converter 3 in the buffer register 4 appears also when the timing signal TM10 is in the 1 level, but the pulse TBR appears after the disappearance of the pulse TAD. Thus, by use of timing regulating pulses TM1 to TM10 for regulating the timing of the individual digits, the $l$ th data D($l$) starting from time T($l$) and the ($l + 1$)th data D($l + 1$) starting from time T($l + 1$) can be arranged in a serial signal.

Figure 3:
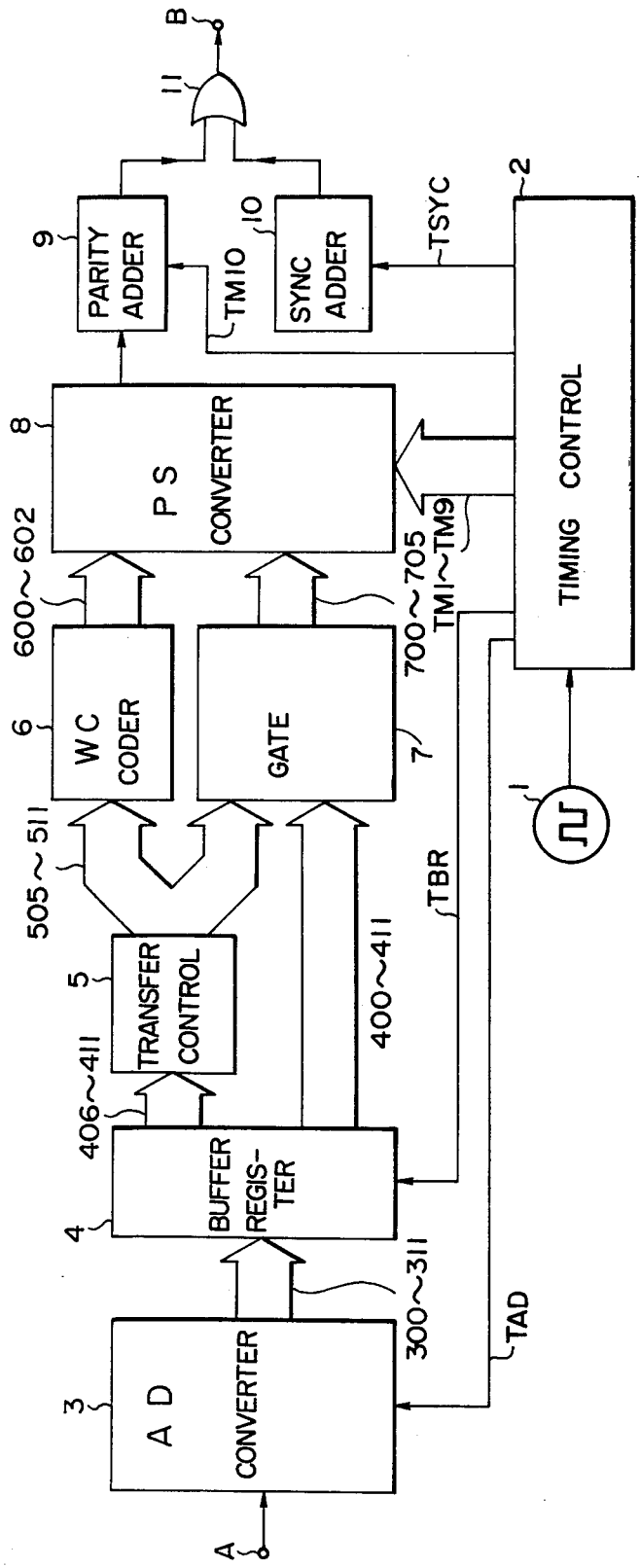
FIG. 3 is a block diagram of a typical embodiment of the present invention.
Figure 4:
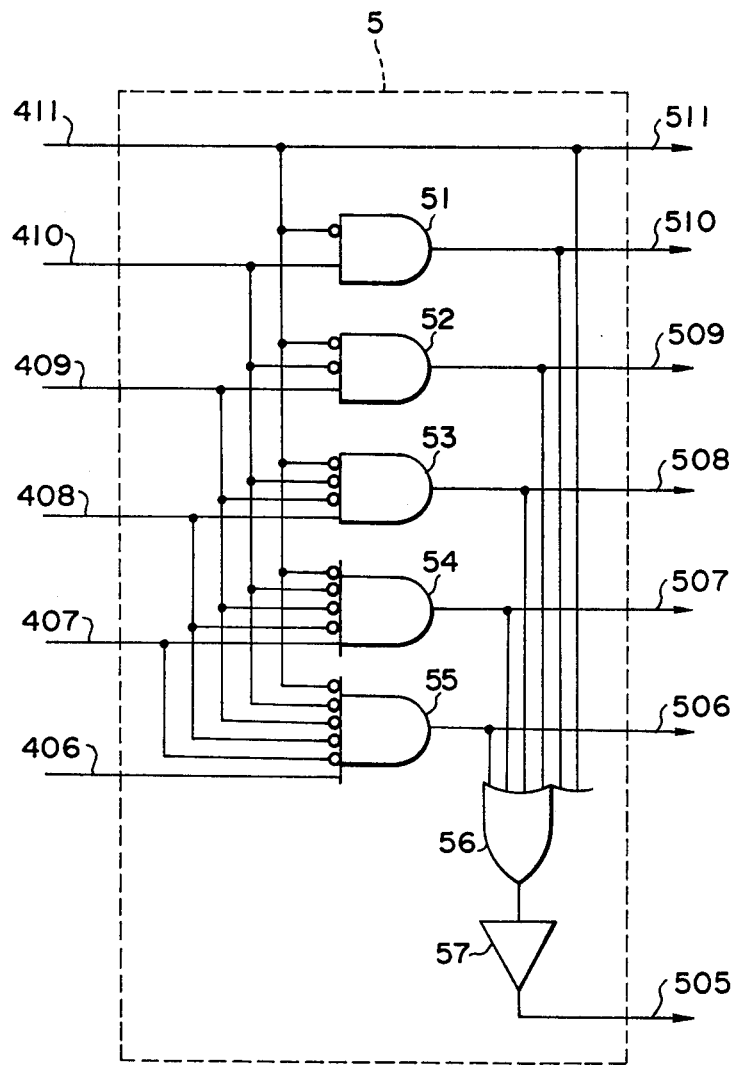
FIG. 4 shows the detailed structure of the block 5 in FIG. 3.

The generation of the parity bit P is carried out in the block 9 in FIG. 3 in response to the application of the timing signal TM10. Further, the generation of the synchronizing signal SYC is carried out in the block 10 in FIG. 3 in response to the application of a timing signal TSYC as shown in FIG. 7b. In this manner, a data signal as shown in FIG. 7b can be sent out from the output terminal B in FIG. 3 toward a receiving station. A modulator (not shown) may be connected to the output terminal B so that the output signal may be transmitted to the receiving station after being subjected to high frequency modulation.

It is apparent from the foregoing description of a typical embodiment of the present invention that the objects of the present invention can be completely attained and the desired practical effects can also be exhibited.

While the embodiment of the present invention has been described with reference to cyclic transmission, it is readily apparent from the foregoing description that the present invention is applicable also to other forms of transmission. Further, the present invention provides a great flexibility due to the fact that the number of required bits of data can be sought from the inequalities (3) and (4) on the basis of the condition given by a specific transmission system. Further, as a matter of course, the desired reduction in the number of bits can also be attained when the blocks 5, 6 and 7 are used as input converting means in a display circuit and a con- $I_{LSD1} = 100 \cdot (\frac{1}{2})^1 = 50 < 60$ A.

Therefore, the arrangement of bits when the weight bit $WB = 0$ is determined as shown in Table 2.

Table 2

| Digit | Corresponding analog quantity |
|---|---|
| $2^7$ | 6400 |
| $2^6$ | 3200 |
| $2^5$ | 1600 |
| $2^4$ | 800 |
| $2^3$ | 400 |
| $2^2$ | 200 |
| $2^1$ | 100 |
| $2^0$ | 50 |

However, the bit position of ($I_D/2$) cannot yet be determined from the above condition.

Figure 8:
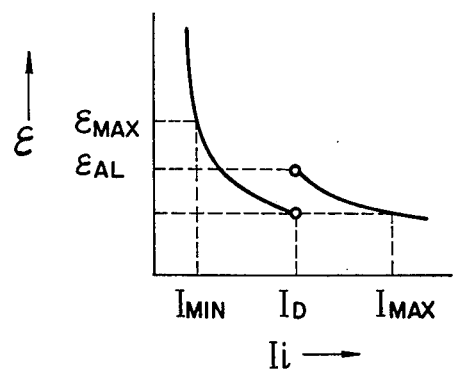
FIG. 8 shows a manner of AD conversion conveniently used in the practice of the present invention.
Figure 11:
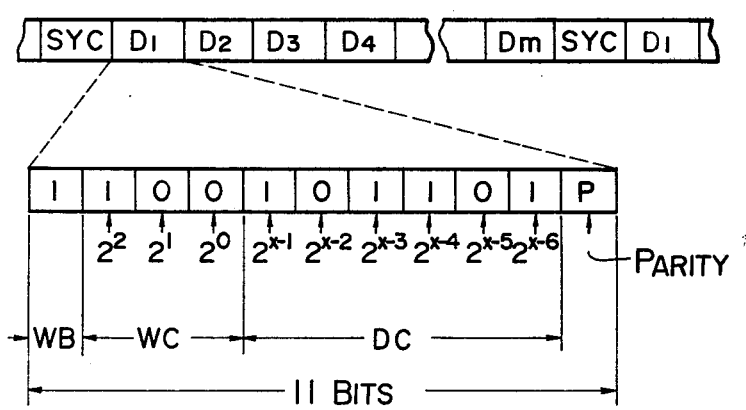
FIGS. 10 and 11 are views similar to FIGS. 3 and 2 respectively but showing another embodiment which employs the AD converter shown in FIG. 9.

In order that the AD conversion error be less than the allowable error $\epsilon_{AL}$ shown in FIG. 8, when the weight bit WB is 1, the relation $$\pm \frac{\frac{I_{MAX}}{2^{q+1}}}{I_D} \leq \epsilon_{AL} \tag{11}$$

must be satisfied since $I_D$ in this case corresponds to $I_{MIN}$ in the inequality (2). The numerator in the left-hand member in the inequality (11) can be expressed as $\pm \frac{1}{2} \cdot I_{LSD2}$ where $I_{LSD2}$ is the weight of the least significant digit of the quantized value. Thus, the inequality (11) can be expressed as $$\frac{\pm \frac{1}{2} \cdot I_{LDS2}}{I_D} \leq \epsilon_{AL} \tag{12}$$

From the inequality (12), $I_{LSD2}$ is given by $$I_{LSD2} \leq 2 \cdot \epsilon_{AL} \tag{13}$$

The value of $I_D$ relative to $I_{MIN} = 100$ is selected to be $I_D = 12800$, and this value and the value of $\epsilon_{AL} = 0.04$ are put in the inequality (13). It is known that $I_{LSD2}$ is selected to satisfy the relation $I_{LSD2} \leq 1024$. This $I_{LSD2}$ is also desirably selected to be similar to one in the bit arrangement obtained when the weight bit WB is 0 or the value of $I_{LSD2}$ is desirably selected from the numbers which are obtained by multiplying the numbers in the right-hand column of Table 2 above described. Suppose that the value of $I_{LSD2}$ satisfying these conditions is $I_{LSD2} = 800$, then the bit arrangement when the weight bit WB is 1 is as shown in Table 3.

Table 3

| Digit | Corresponding analog quantity |
|---|---|
| $2^7$ | 102400 |
| $2^6$ | 51200 |
| $2^5$ | 25600 |
| $2^4$ | 12800 |
| $2^3$ | 6400 |
| $2^2$ | 3200 |
| $2^1$ | 1600 |
| $2^0$ | 800 |

It will be seen that these values are well balanced with those in the case in which the weight bit WB is 0, and $I_D = 12800$ is an appropriate value. Therefore, the bit arrangement in this case is finally determined from Table 4.

Table 4

| Digit | WB | $2^7$ | $2^6$ | $2^5$ | $2^4$ | $2^3$ | $2^2$ | $2^1$ | $2^0$ |
|---|---|---|---|---|---|---|---|---|---|
| $I_i < I_D$ | 0 | 6400 | 3200 | 1600 | 800 | 400 | 200 | 100 | 50 |
| $I_i \geq I_D$ | 1 | 102400 | 51200 | 25600 | 12800 | 6400 | 3200 | 1600 | 800 |
| $\epsilon \times 100$ (%) | | 0.39 | 0.78 | 1.57 | 3.13 | 6.25 | 12.5 | 25 | 50 |

It will be seen from Table 4 that $I_D$ is preferably selected to be $I_D = 12800$ A, and the number of bits required for the AD converter in this case is $q + 1 = 9$ bits including the weight bit WB. It is thus apparent that the number of required bits is less by three bits than that in the successive approximation type in which 12 bits are required. This verifies the effectiveness of the AD converter employed in the equipment according to the present invention.

Figure 9:
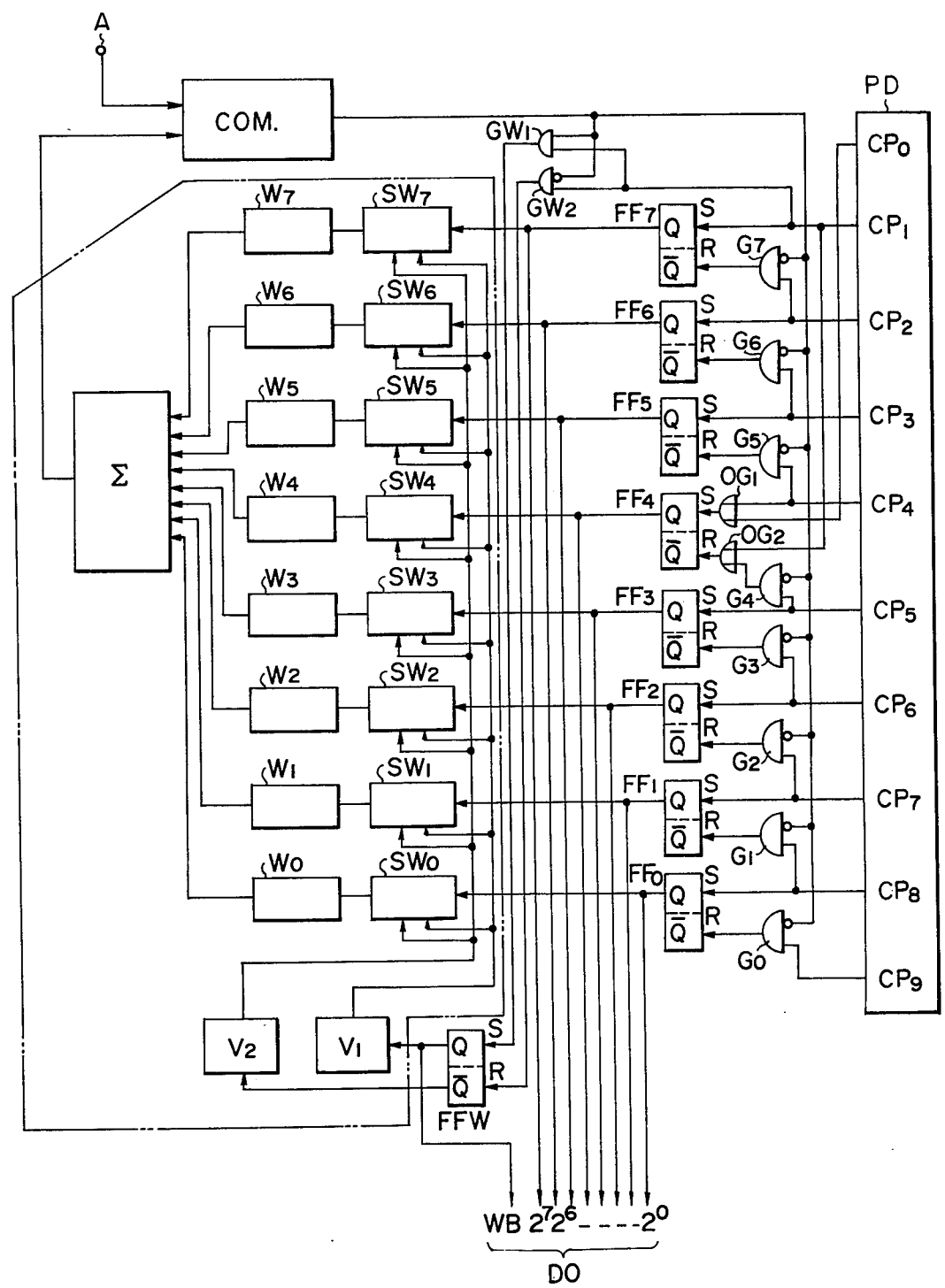
FIG. 9 is a block diagram of an AD converter based on the principle shown in FIG. 8.
Figure 10:
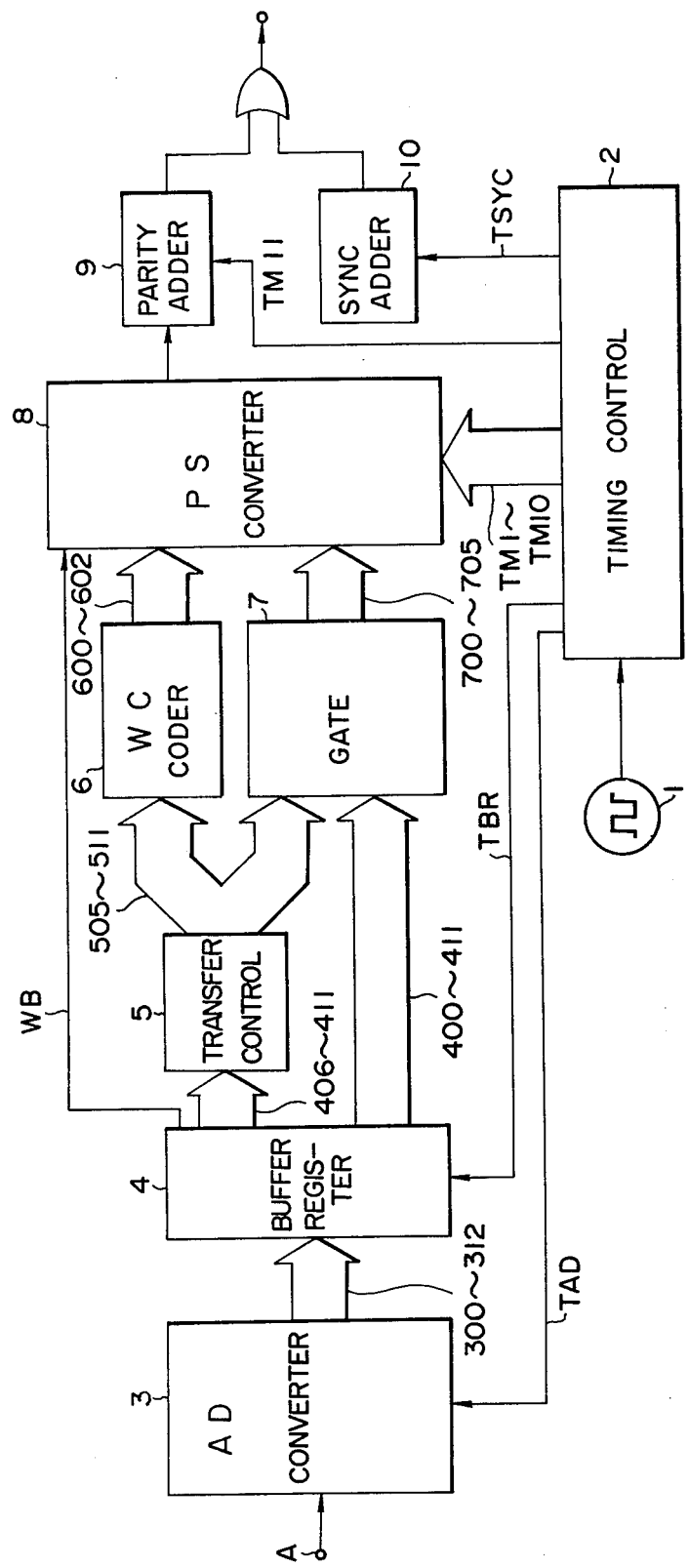

Referring to FIG. 9, an analog input is applied to an input terminal A of the AD converter, and after the period of time required for conversion, a digital output of ($q + 1$) bits corresponding to the level of the analog input appears at a plurality of terminals at the output end DO of the AD converter. The structure and operation of this AD converter will be described in more detail with reference to FIG. 9.

Flip-flops $FF_7$ to $FF_0$ are arranged to correspond to the weights of individual bits and are set successively in the above order in response to the application of timing clock pulses from a pulse distributing circuit PD. The flip-flops $FF_7$ to $FF_0$ control associated switching means $SW_7$ to $SW_0$ and weight generating means $W_7$ to $W_0$ respectively so that the voltage of a reference voltage source ($V_1$ or $V_2$) can be applied or not applied to the weight generating means $W_7$ to $W_0$ depending on the state of the respective flip-flops $FF_7$ to $FF_0$. These voltage values are then added together in an analog adder means $\Sigma$ to obtain an output voltage E which is compared in a comparator COM with an input voltage $E_i$ applied to the input terminal A of the AD converter. When $E_i \geq E_\Sigma$, the output of the comparator COM is 1 and the flip-flops $FF_7$ to $FF_0$ remain in the set position, while when $E_i < E_\Sigma$, the output of the comparator COM is 0 and the flip-flops $FF_7$ to $FF_0$ are reset in response to the application of the next timing clock pulses. The above operation is repeated by the number of bits according to the order of from the largest weight to the smallest weight. (In the case of conversion into a binary number, precision of ($1/2^q$) is obtained with repetition of $q$ times). When the above operation is repeated $q$ times, that is, when one cycle is completed, the output values of the individual flip-flops $FF_7$ to $FF_0$ represent the AD converted output DO ($2^7$ to $2^0$). INHIBIT gates $G_7$ to $G_0$ in FIG. 9 control the application of reset pulses to the respective flip-flops $FF_7$ to $FF_0$. For example, these gates $G_7$ to $G_0$ inhibit passage of the reset pulses when the output of the comparator COM is 1 and allow for passage of the reset pulses when the output of the comparator COM is 0.

The operation of the AD converter shown in FIG. 9 will be described in more detail. The pulse distributing circuit PD generate successive timing clock pulses $CP_0$ to $CP_9$. An output appears at the terminal Q or $\overline{Q}$ of inator means having comparator means for discriminating whether the physical quantity is larger than a predetermined value or not, selecting means for selecting one of a plurality of predetermined different reference values in accordance with the output of said discriminating means, means for determining a weight for the digits of the digital code signal, said comparator means comparing the physical quantity with a value which is a function of the selected reference value and a weight which is predetermined depending on the position of each of the digits constituting the digital code signal, and compressing means for determining the position of the most significant digit in said digital code signal and for compressing said digital code signal in dependence on the position of the most significant digit in said digital code signal.

2. A coding equipment according to claim 1, wherein said compressing means produces a train of codes including a code indicative of the position of the most significant digit and a predetermined number of digits succeeding the most significant digit.

3. A coding equipment according to claim 2, further comprising means for generating a parity bit and a synchronizing signal for the train of codes of said compressing means.

4. A coding equipment comprising:

analog-digital converting means including a plurality of first flip-flop means arranged in a predetermined order and having first and second input terminals, each of said flip-flop means being initially at a first state and changeable to a second state from the first state in response to a pulse signal applied to its first input terminal, said first flip-flop means being changeable to the first state from the second state in response to a pulse signal applied to its second input terminal, a plurality of switch means, each of said switch means being coupled to a respective one of said first flip-flop means and being responsive to the second state of the respective first flip-flop means for being rendered operative to permit an input signal applied thereto to pass therethrough, a plurality of weighting means, each of said weighting means being coupled to a respective one of said switching means for receiving the signal passed through the respective switching means and producing an output which is a function of the signal and a weight predetermined for said weighting means, adder means for producing an output corresponding to the sum of the outputs of said weighting means, comparator means for comparing the output of said adder means with a physical quantity to be coded and for producing a signal of a first level when said physical quantity is not less than the output of said adder means and a signal of second level when said physical quantity is less than the output of said adder means, second flip-flop means having first and second input terminals, said second flip-flop means being initially at a first state and changeable from the first to a second state in response to a pulse signal applied to its second input terminal, said second flip-flop means being changeable from the second state to the first state in response to a pulse signal applied to its first input terminal, means for applying to each of said switching means, as the input signal thereto, a first reference signal indicative to a first reference value when said second flip-flop means is at the first state and a second reference signal indicative of a second reference value when said second flip-flop means is at the second state, pulse distributing means for producing a plurality of signals in a predetermined order and in a predetermined timing, said pulse distributing means applying the first pulse signal to the first pulse input terminal of a predetermined one of said plurality of first flip-flop means and applying the second pulse signal to the first input terminal of the first of the predetermined arrangement of said first flip-flop means and a second input terminal of said predetermined one of said first flip-flop means, said pulse distributing means applying the third and succeeding pulse signals to the first input terminals of the second and succeeding first flip-flop means, respectively, means for applying a pulse signal to the first input terminal of said second flip-flop means in response to said comparator means producing the first level signal and the second pulse of said pulse distributing means, and for applying a pulse signal to the second input terminal of said second flip-flop means in response to said comparator means producing the second level signal and said second pulse signal of said pulse distributing means, means for applying the third and successive pulse signals produced by said pulse distributing means to the second input terminal of the first flip-flop means in accordance with the second level signal being produced by said comparator means, and output means for producing a plurality of output signals indicative of whether respective ones of the plurality of first flip-flop means are at the first state or the second state and an output signal indicative of whether said second flip-flop means is at the first state or the second state;

means for determining the position of the first flip-flop means in the first state corresponding to an output in the most significant digit position;

encoding means for producing a code in dependence on the position of said determined first flip-flop means;

gate means for permitting selected ones of said plurality of output signals from said output means, respectively, corresponding to a predetermined number of the first flip-flop means succeeding said determined first flip-flop means to pass therethrough; and means responsive to at least the code produced by said encoding means and said selected output signals of said output means for producing a train of codes.

* * * * *